(12) United States Patent
Hocker

(10) Patent No.: US 7,564,250 B2
(45) Date of Patent: Jul. 21, 2009

(54) PULSED METHODS AND SYSTEMS FOR MEASURING THE RESISTANCE OF POLARIZING MATERIALS

(75) Inventor: Lon Hocker, Hilo, HI (US)

(73) Assignee: Onset Computer Corporation, Bourne, MA (US)

( * ) Notice: Subject to any disclaimer, the term of this patent is extended or adjusted under 35 U.S.C. 154(b) by 256 days.

(21) Appl. No.: 11/732,207

(22) Filed: Jan. 30, 2007

(65) Prior Publication Data

US 2007/0182426 A1    Aug. 9, 2007

Related U.S. Application Data

(60) Provisional application No. 60/763,505, filed on Jan. 31, 2006.

(51) Int. Cl.
*G01R 27/08* (2006.01)
(52) U.S. Cl. .................. 324/723; 324/694; 324/712; 324/713
(58) Field of Classification Search ................. 324/694, 324/704, 710, 712, 713, 722, 723
See application file for complete search history.

(56) References Cited

U.S. PATENT DOCUMENTS

| | | | | |
|---|---|---|---|---|
| 4,419,021 A * | 12/1983 | Terada et al. | ............. | 73/335.05 |
| 4,449,188 A * | 5/1984 | Unoguchi et al. | ........... | 700/276 |
| 5,274,334 A * | 12/1993 | Mills | ........................ | 324/678 |
| 6,714,876 B2 * | 3/2004 | Kimoto et al. | ................ | 702/24 |

* cited by examiner

*Primary Examiner*—Timothy J Dole
(74) *Attorney, Agent, or Firm*—Weingarten, Schurgin, Gagnebin & Lebovici LLP

(57) ABSTRACT

A system and method for measuring resistance of a polarizing material are disclosed. The system includes a voltage divider circuit having a first resistive element of known resistance and the polarizing material of unknown resistance and a processing unit. The processing unit is electrically-coupled to the voltage divider circuit and adapted to apply a voltage across the voltage divider circuit. A first input/output (I/O) pin is electrically-coupled between the processing unit and the first resistive element. A second pin is electrically-coupled between the processing unit and a junction between the polarizing material and the first resistive element. A controller is adapted to cause the second pin to short the polarizing material after a measurement is completed, to bleed off any residual polarization from the capacitive element of the polarizing material.

16 Claims, 1 Drawing Sheet

PULSED METHODS AND SYSTEMS FOR MEASURING THE RESISTANCE OF POLARIZING MATERIALS

CROSS REFERENCE TO RELATED APPLICATIONS

Priority to U.S. provisional patent application 60/763,505 entitled "Improved Pulsed Method for Measuring the Resistance of Polarizing Materials" filed Jan. 31, 2006 is claimed.

STATEMENT REGARDING FEDERALLY SPONSORED RESEARCH OR DEVELOPMENT

Not Applicable

BACKGROUND OF THE INVENTION

Polarizing materials, such as those used for measuring relative humidity, can be thought of as a resistive element and a capacitive element operatively-coupled in series. Determining the resistance of the polarizing material requires applying a voltage, which will partially add charge to a capacitive element. This polarization may be carried over to the subsequent measurements, making subsequent measurements inaccurate.

Conventional methods of measuring the resistance of polarizing materials have used alternating current (AC). With an AC methodology, polarization built up in the capacitive element during the positive portion of the cycle is undone by polarization of an opposite sign, occurring during the negative portion of the cycle. As a result, the effect of polarization is not fully seen because, when the AC waveform is integrated over a cycle or period, the net voltage is equal to zero. Using AC to measure the resistance of polarizing materials, however, requires electronics that are not commonly integrated into a microprocessor. Furthermore, AC methods are relatively slow because both the positive and negative portions of the cycle are used.

As an alternative to AC methods, a voltage divider can be used to provide pulsed measurement of the polarizing material. Pulse measurement, typically, only makes use of the positive reference cycle of the cycle. A voltage divider, however, is useful only if the time between measurements is substantially greater than the pulse width. When the time between measurements is substantially greater than the pulse width, polarization remaining in the capacitive element will have time to bleed off through the resistor in the voltage divider. However, when time between measurements is not sufficiently large, some residual polarization may remain. As a result, currently, pulsed measurement of polarizing materials is effective only if the material polarizes weakly enough so that the polarization in the capacitive element bleeds off completely between subsequent measurements.

It would be desirable to provide a system and a method for measuring the resistance of polarizing materials, including heavily-polarized materials, using pulsed excitation. Moreover, it would be desirable to provide a system and a method for measuring the resistance of polarizing materials wherein, after the pulse is removed, residual polarization in the capacitive element is removed by shorting the polarizing material.

BRIEF SUMMARY OF THE INVENTION

A system and method for measuring resistance of a polarizing material are disclosed. The system includes a voltage divider circuit having a first resistive element of known resistance and a polarizing material of unknown resistance; and a processing unit. The first resistive element is coupled to the polarizing material which is electrically-coupled to ground. A first input/output (I/O) pin is electrically-coupled between the processing unit and the first resistive element. A second pin is electrically-coupled between the processing unit and a junction between the polarizing material and the first resistive element.

The processing unit is adapted to initially drive the first and second I/O pins low (0), then, when it is time to make a measurement, to apply a voltage across the voltage divider circuit by driving the first I/O pin high (1) while causing the second pin to act as an input to an analog-to-digital converter (ADC). The second pin is adapted to provide a voltage measurement at a junction between the first resistive element and the polarizing material and, furthermore, to process the voltage measurement data through an analog-to-digital converter when instructed to do so by the controller. These voltage data are used to provide the measurement of the resistance of the polarizing material. The controller is further adapted to drive the first I/O pin low (0), after the measurement is completed, and also to cause the second pin to short the polarizing material after a measurement is completed, to bleed off any residual polarization from the capacitive element of the polarizing material.

BRIEF DESCRIPTION OF THE SEVERAL VIEWS OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views.

DETAILED DESCRIPTION OF THE INVENTION

Systems and methods for measuring the resistance of polarizing materials, such as for a relative humidity sensor, are disclosed. More specifically, systems and methods for measuring the resistance of polarizing materials using a voltage divider and pulsed excitation are disclosed.

Figure 1:
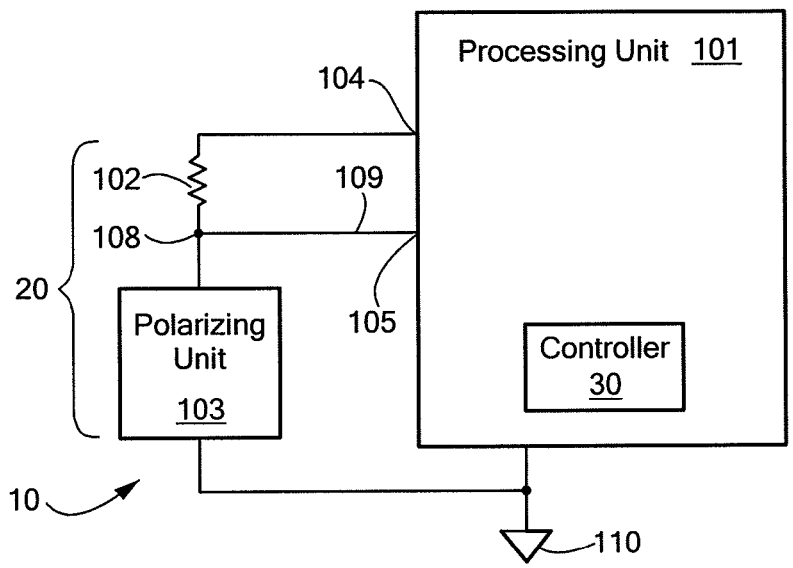
FIG. 1 shows a block diagram of a device and system for measuring the resistance of polarizing materials.

Referring to FIG. 1, a system 10 for measuring the resistance of a polarizing material is shown. The system 10 includes a voltage divider circuit 20 and a processing unit 101.

The processing unit 101, such as a microprocessor, includes a voltage (power) source, a central processing unit (CPU), random access memory (RAM), read-only memory (ROM), and a controller 30. Voltage sources, CPUs, ROM, RAM, and controllers 30 for a processing unit 101, especially for a microprocessor, are all well-known in the art and will not be described in detail. The operation of the controller 30 and its interaction with the other elements of the system 10 will be described in greater detail below.

The voltage divider circuit 20 includes a first resistive element 102, e.g., a resistor, thermistor, and the like, of known resistance, and a polarizing material 103, such as a relative humidity sensor and the like, whose resistance is unknown. Resistive elements 102 and polarizing materials 103 are well-known to the art and will not be described in greater detail. Also well known are Kirchoff's current and voltage laws with which one skilled in the art can measure the resistance of one of the resistive elements in a voltage divider circuit, e.g., the polarizing material, knowing the resistance of the other resistive element and the voltage input and by measuring the voltage at some junction between the two resistive elements.

The first resistive element 102 and polarizing material 103 of the voltage divider circuit 20 are electrically-coupled in series to ground 110. More specifically, one end of the first resistive element 102 is electrically-coupled to a first input/output (I/O) pin 104 operatively-coupled to the processing unit 101 and the other end of the first resistive element 102 is electrically-coupled to a second pin 105 operatively-coupled to the processing unit 101. Furthermore, a first end of the polarizing material 103 is electrically-coupled to the resistive element 102 and to the second pin 105 at a junction 108. A second end of the polarizing material 103 is electrically-coupled to ground 110.

The first I/O pin 104 is adapted to be driven high (1) or low (0). In a high (1) state, voltage from a voltage source (not shown) integral to the processing unit 101 is applied to the voltage divider circuit 20 and is used as a positive reference to the analog-to-digital converter (ADC) in the processing unit. In a low (0) state, the I/O pin 104 is driven to ground.

The second pin 105 is adapted to be driven low (0) or to provide an input, such as the voltage at junction 108, to the ADC. In a low (0) state, the second pin 105 is driven to ground. In an ADC state, the magnitude of the voltage at junction 108 is measured and provided to an ADC.

Having described a system 10 for measuring the resistance of a polarizing material 103, a method of doing so and the interplay between the elements of the system 10 will now be described. The controller 30, which can be hard-wired or application-driven, provides overall control of the operation of the system 10 and, more particularly, controls the states of the first I/O pin 104 and the second pin 105.

The controller 30 controls the state of the first I/O pin 104 by providing an analog or digital signal to drive the first I/O pin 104 high or low. When the controller 30 drives the first I/O pin 104 low (0), the first I/O pin 104 is driven to ground and the entire system 10 is essential OFF. The system 10 is ON when the controller 30 drives the first I/O pin 104 high (1). More specifically, when the controller 30 drives the first I/O pin 104 high (1), power (voltage) from the voltage source (not shown) is applied to the voltage divider circuit 20 via the first I/O pin 104.

As mentioned above, the second pin 105 is adapted to operate in one of at least two states: a low (0) state and an ADC state. The controller 30 drives the second pin 105 low (0) whenever it drives the first I/O pin 104 low (0). The second pin 105, when not driven low, is programmed to the ADC state.

When the second pin 105 is driven low (0), line 109 to the junction 108 is grounded. Those skilled in the art can appreciate that the magnitude of the voltage at the junction 108 between the resistive element 102 and the polarizing material 103 is a function of the relative resistances of the resistive element 102 (a known) and the polarizing material 103 and also of the input voltage (a known).

The controller 30 is further structured and arranged to drive the first I/O pin 104 to a high (1) state and the second pin 105 to its ADC state. During the ADC state, the second pin 105 is structured and arranged to operate as an ADC, converting the analog waveform of the voltage at the junction 108 to digital data. These digital data are used for determining the resistance of the polarizing material 103. They can be stored in suitable memory in the processing unit; processed internally; and/or transmitted to a local or remote destination outside of the processing unit 101 for external processing.

Once the digital data have been captured, the controller 30 is, then, structured and arranged to drive each of the first I/O pin 104 and second pin 105 to their low (0) states. During the low (0) state, the junction 108 between the resistive element 102 and the polarizing material 103 is driven to ground, shorting the polarizing material 103. As a result, any residual polarization stored in the capacitive element of the polarizing material 103 is rapidly bled off. Preferably, the controller 30 is structured and arranged to provide a sequence of signals to change the state of the first I/O pin 104 from the low (0) state to the high (1) state back to the low state (0) while simultaneously changing the state of the second pin 105 from the low (0) state to the ADC state back to the low state (0). More preferably, the controller 30 is structured and arranged to provide a sequence of signals rapidly so that the accumulation of polarization by the capacitive element of the polarizing material 103 is reduced.

Figure 2:
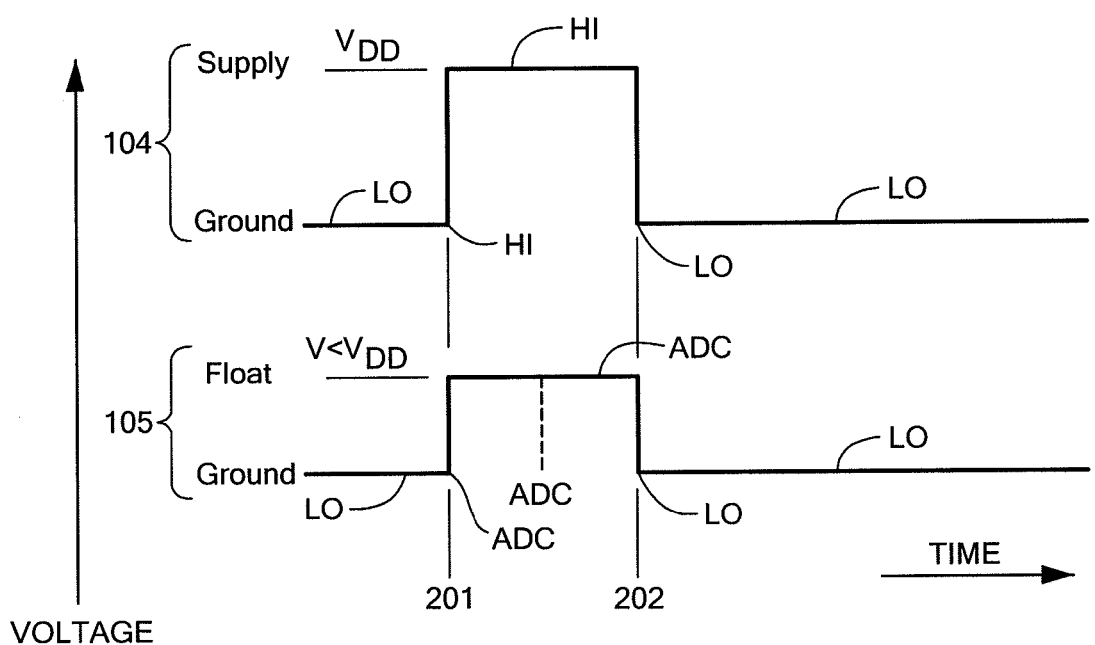
FIG. 2 shows voltage waveform diagrams for the same.

FIG. 2 provides voltage waveforms to illustrate further the signal sequencing by the controller 30 as well as to describe methods for measuring the resistance of the polarizing material 103. FIG. 2 shows voltage waveforms at the first I/O pin 104 (top) and at the second pin 105 (bottom). Before any measurement sequence begins, the controller 30 drives both pins 104 and 105 low (0). At time $T_{201}$, the controller 30 drives the first I/O pin high (1) and transmits a signal to the second pin 105 to change its state to an ADC mode and, more specifically, to measure the divided voltage at junction 108 and to perform analog-to-digital conversion on the voltage data. As a result, at time $T_{201}$, the positive reference signal of the voltage source is applied to the voltage divider circuit 20 via the first I/O pin 104. Moreover, at time $T_{201}$, the voltage at junction 108 provides a measure of the relative resistances of the resistive element 102 and the polarizing material 103. Accordingly, voltage data are captured for use in determining the resistance of the polarizing material 103.

These data can be stored in suitable memory in the processing unit 101; can be processed immediately by the CPU of the processing unit 101, e.g., using an application or driver program provided expressly for such processing; and/or can be transmitted to a local or remote destination external to the processing unit 101, e.g., to a personal computer or remote processing unit.

At time $T_{202}$, after analog-to-digital conversion has been completed, the controller 30 drives each of the first I/O pin 104 and the second pin 105 low (0), which is to say to ground. By driving the second pin 105 low (0), the polarizing material 103 is shorted. As a result, any residual polarization stored in the capacitive element of the polarizing material 103 is removed.

Although the invention has been described whereby, at time $T_{201}$, the state of the second pin 105 is changed to its ADC mode concurrent with driving the first I/O pin 104 to its high (1) state, driving the second pin 105 to its ADC mode can occur at any time between time $T_{201}$ and time $T_{202}$.

Indeed, by driving the second pin 105 low (0) after analog-to-digital conversion, the polarizing material 103 only has to discharge through a resistance commensurate with the effective resistance of the line 109 and the input resistance associated with the second pin 105 to ground 110 rather than having to discharge through the resistance of the resistive element 102. The latter resistance, typically, can be on the order of about 100 kΩ while the former resistance, typically, can be on the order of about 100Ω or less. Consequently, discharge time can be reduced by a factor of about 1,000. Advantageously, a dramatic reduction in discharge time enables measuring more strongly polarizing materials or measuring the same, more weakly polarizing materials at a reduced duty cycle.

Although the invention is described through the above-described exemplary embodiments, it will be understood by those of ordinary skill in the art that modifications to, and variations of, the illustrated embodiments may be made without departing from the inventive concepts disclosed herein. Accordingly, the invention should not be viewed as limited, except by the scope and spirit of the appended claims.

What is claimed is:

1. A system for measuring resistance of a polarizing material, the system comprising:
   a voltage divider circuit having a first resistive element of known resistance and the polarizing material of unknown resistance that are electrically-coupled in series to ground;
   a processing unit electrically-coupled to the voltage divider circuit and adapted to apply a voltage across said voltage divider circuit;
   a first input/output (I/O) pin electrically-coupled between the processing unit and the first resistive element and having a state;
   a second pin electrically-coupled between the processing unit and a junction between the polarizing material and the first resistive element and having a state; and
   a controller that is structured and arranged to control the state of the first I/O pin to apply a voltage across the voltage divider circuit while simultaneously controlling the state of the second pin to enable a measurement of a voltage at the junction, and to control the state of the first I/O pin and the second pin to apply ground to each, whereby the polarizing material is shorted through the second pin.

2. The system as recited in claim 1, wherein the polarizing material is a relative humidity sensor.

3. The system as recited in claim 1, wherein the first resistive element is selected from the group comprising a resistor and a thermistor.

4. The system as recited in claim 1, wherein the second pin is operationally-coupled to an analog-to-digital converter.

5. The system as recited in claim 4, wherein the analog-to-digital converter is structured and arranged to measure voltage at the junction between the polarizing material and the first resistive element.

6. The system as recited in claim 1, wherein the controller is structured and arranged to operate the second pin in a grounded state or in an analog-to digital conversion state.

7. A method for measuring resistance of a polarizing material, the method comprising:
   providing a voltage divider circuit having a first resistive element of known resistance and the polarizing material of unknown resistance that are electrically-coupled in series to ground;
   electrically-coupling a processing unit to the voltage divider circuit;
   applying a voltage from the processing unit across said voltage divider circuit;
   measuring a voltage, using the processing unit, at a junction between the first resistive element and the polarizing material; and
   shorting the polarizing material after the voltage has been measured and before a new resistance measurement is made by using the processing unit to ground the junction between the first resistive element and the polarizing material.

8. The method as recited in claim 7 further comprising removing the voltage across said voltage divider circuit after said voltage has been measured.

9. The method as recited in claim 7 further comprising determining the resistance of said polarizing material based on the applied voltage, the voltage measured at the junction between said first resistive element and said polarizing material, and the known resistance of the first resistive element.

10. The method as recited in claim 7, wherein measuring the voltage at the junction between said first resistive element and said polarizing material further includes processing the measured voltage through an analog-to-digital converter.

11. The method as recited in claim 7, wherein the polarizing material is shorted sufficiently long to allow any residual polarization in said polarizing material to bleed out.

12. A method for measuring resistance of a polarizing material, the method comprising:
   providing a voltage divider circuit having a first resistive element of known resistance and the polarizing material of unknown resistance that are electrically-coupled in series to ground;
   electrically-coupling a processing unit to the voltage divider circuit which includes:
      electrically-coupling a first input/output (I/O) pin between the processing unit and the first resistive element, and
      electrically-coupling a second pin between the processing unit and a junction between the polarizing material and the first resistive element;
   applying a voltage across said voltage divider circuit via the first I/O pin having a state;
   measuring a voltage at the second pin having a state; and
   controlling the states of the first I/O and second pins after the voltage has been measured and before a new resistance measurement is made, wherein controlling the state of the second pin includes shorting said polarizing material to ground through the second pin after the voltage has been measured and before a new resistance measurement is made.

13. The method as recited in claim 12 further comprising removing the voltage across said voltage divider circuit after said voltage has been measured at said second pin.

14. The method as recited in claim 12 further comprising determining the resistance of said polarizing material based on the applied voltage, the voltage measured at the junction between said first resistive element and said polarizing material, and the know resistance of the first resistive element.

15. The method as recited in claim 12, wherein measuring the voltage at the junction between said first resistive element and said polarizing material further includes processing the measured voltage through an analog-to-digital converter.

16. The method as recited in claim 12, wherein the polarizing material is shorted sufficiently long to allow any residual polarization in said polarizing material to bleed out.

* * * * *